United States Patent [19]

Eggermont et al.

[11] 4,109,203

[45] Aug. 22, 1978

[54] DELTA-MODULATION ENCODER

[75] Inventors: Ludwig Desiré Johan Eggermont; Eise Carel Dijkmans; Karel Riemens, all of Eindhoven, Netherlands

[73] Assignee: U.S. Philips Corporation, New York, N.Y.

[21] Appl. No.: 690,078

[22] Filed: May 26, 1976

[30] Foreign Application Priority Data

Jun. 12, 1975 [NL] Netherlands ........................ 7506986

[51] Int. Cl.$^2$ ........................................... H03K 13/22

[52] U.S. Cl. ................................ 325/38 B; 332/11 D

[58] Field of Search .................... 325/38 B; 332/11 D

[56] References Cited

U.S. PATENT DOCUMENTS

| | | | |
|---|---|---|---|
| 3,746,990 | 7/1973 | Diberder | 332/11 D |
| 3,806,806 | 4/1974 | Brolin | 332/11 D |
| 3,899,754 | 8/1975 | Brolin | 325/38 B |

*Primary Examiner*—Robert L. Griffin
*Assistant Examiner*—Michael A. Masinick
*Attorney, Agent, or Firm*—Frank R. Trifari; Henry I. Steckler

[57] ABSTRACT

In a delta-modulation encoding arrangement having step-size control drift voltages and miss-match between the charge and discharge pulses for the first integrating network in the feedback circuit produce an additional DC voltage on this integrating network. This additional DC voltage is compensated by an additional feedback circuit comprising a second integrating network. However, if the signal to be encoded rapidly decreases from a large to a small amplitude and when after this rapid decrease the information signal only has a small amplitude an additional distortion is introduced for these small signals. To obviate this a modulation arrangement is included in the extra feedback circuit, which modulation arrangement is controlled by a control signal which derives a control signal from the delta modulation output pulses. The energy contents of the delta modulation pulses which are applied through the modulation arrangement to the second integrating network is varied in such a way that this energy contents decreases when the step-size increases and vice versa.

4 Claims, 3 Drawing Figures

DELTA-MODULATION ENCODER

BACKGROUND OF THE INVENTION (1) Field of the Invention

The invention relates to a delta-modulation encoder for information signals, comprising a first input circuit provided with a cascade arrangement of a decoder and a comparison circuit, said information signals being applied to said first input circuit, which in response thereto produces an output signal which is applied to a quantizing device which is controlled by a pulse generator and which comprises an output circuit at which the delta modulation output pulses are produced; said output pulses being further applied through a first feedback circuit to the first input circuit; compensation means comprising an integrating network, a second input circuit which is coupled to the output circuit of said quantizing device and an output circuit coupled to said comparison circuit.

Here the term delta-modulation encoder must also be understood to mean a delta-sigma-modulation encoder which differs from the delta-modulation encoding arrangement in the place of the decoder in the input circuit with respect to the comparison circuit.

Encoding arrangements of the type described and which are in use nowadays, are all arranged for encoding information signals varying over a large dynamic range, such as speech signals. For high accuracy encoding of such signals with a comparatively low sampling frequency these encoding arrangements comprise dynamic control means which usually consist of a step-size control circuit included in the first feedback circuit and through which the output pulses of the quantization device are applied to the input circuit. This step-size control circuit varies the energy contents of the pulses fed to it between a predetermined minimum and a predetermined maximum value. The energy contents of these pulses is, for example, proportional to the level of the information signals and is usually derived by the step-size control circuit from the output pulses of the quantizing device.

(2) Description of the Prior Art

A coding arrangement of the type described and which comprises the above-mentioned dynamic control means has already been described in the prior U.S. Pat. No. 3,831,092. In this encoding arrangement the compensation means are constituted by a second feedback circuit which includes said integrating network and to which the output pulses of the quantizing device are applied. The output circuit of the second feedback circuit is coupled with said comparison circuit. In this prior art arrangement the decoding arrangement in the input circuit is constituted by the integrating network and the cut-off frequency of the integrating network in the second feedback circuit is considerably lower than that of the integrating network in the input circuit. The output pulses of the quantizing device are applied to the integrating network in the second feedback circuit with a predetermined energy content. As explained in said U.S. Pat. No. 3,831,092 this second feedback circuit compensates for drift voltages which are produced in the various elements of the encoding arrangement. On the one hand the use of this compensation circuit increases the dynamic range by approximately 10–15 dB and on the other hand an improvement of the reproduction quality is obtained for small values of the information signal, that is to say of information signals which are of the order of magnitude of said drift voltages.

Although this prior art encoding arrangements considerably improves the encoding accuracy of small values of the information signals, no improvement, even a deterioration, is found in the encoding accuracy of information signals with small amplitudes when they occur after the information signal has rapidly decreased from a high value to a low value, even when this low value is still considerably larger than said drift voltages.

SUMMARY OF THE INVENTION

It is an object of the present invention to provide a delta-modulation encoding arrangement of the type described above, in which the coding accuracy of in particular small information signals occurring after a rapid decrease of the information signal, is considerably improved.

In accordance with the invention the compensation means comprise a modulation arrangement through which the input circuit of the integrating network is coupled to the output circuit of the quantizing device. A control signal being applied to this modulation arrangement which signal is produced by a control device whose input circuit is coupled with the output circuit of the quantizing device.

The measures according to the invention can in particular be used in the delta-modulation encoding arrangement described above, in which the first feedback circuit comprises a step-size control circuit through which the output pulses of the quantizing device are applied to the input circuit. This step-size control circuit varies the energy content of the output pulses of the quantizing device which are applied to the first input circuit through this step-size control circuit, between a predetermined minimum and a predetermined maximum value. In this encoding arrangement in which output pulses of the quantizing device are directly applied to the second feedback circuit the modulator included in the second feedback circuit is now, for example, coupled between the output of the quantizing device and the integrating network and this modulator and the associated control device are arranged to vary the energy content of the pulses to be applied to the integrating network in the second feedback circuit; this variation taking place in a direction which is opposite to the direction in which the energy content of the pulses applied to the first input circuit are varied. The energy content of the pulses to be applied to the integrating network in the second feedback circuit may be varied continuously and discontinuously. In the discontinuous case these pulses are, for example, applied to the integrating network with predetermined constant energy content, exclusively if the energy content of the pulses applied to the first input circuit has the minimum value. If the energy content of said last pulses differs from this minimum value then, for example, no output pulses of the quantizing device are applied to the integrating network in the second feedback circuit.

By using the measures according to the invention it is achieved that in contradistinction to the delta-modulation encoding arrangements described above, a compensation voltage is produced by the second feedback circuit to compensate for the said drift voltages mainly or exclusively, when information signals of a small value occur.

In the prior art encoder described in which the output pulses of the quantizing device are continuously applied to the integrating network in the second feedback circuit with a predetermined and constant energy contents, this integrating network produces an output voltage which is not only determined by said drift voltages but also by the DC voltage which is built up by the integrating network in the first feedback circuit owing to the inequality of charge and discharge pulses of this network. With a slight proportional mutual inequality of these charge and discharge pulses the DC voltage resulting therefrom, especially when used for dynamic control, may assume a very large value. It is true that this DC voltage decreases at the output of this integrating network when the value of the information signal decreases but owing to the large difference between the cut-off frequencies of the integrating networks in the first and second feedback circuit the output voltage of the integrating network in the second feedback circuit decreases considerably slower than the output voltage of the integrating network in the first feedback circuit. The result is that after a rapid decrease of the value of the information signal the input signal of the encoder is mainly determined by the output of the second feedback circuit so that the information signals which occur after a rapid decrease of the information signal can only be encoded with a large distortion and a considerably increased quantization noise.

By using the measures according to the invention in which the second feedback circuit is mainly active if information signals having small values are applied to the encoder, the output voltage of the second feedback circuit is exclusively determined by said drift voltages, so that also those information signal values which occur after the information signal has decreased rapidly from a high to a low value can be accurately encoded.

DESCRIPTION OF THE EMBODIMENT

Figure 1:
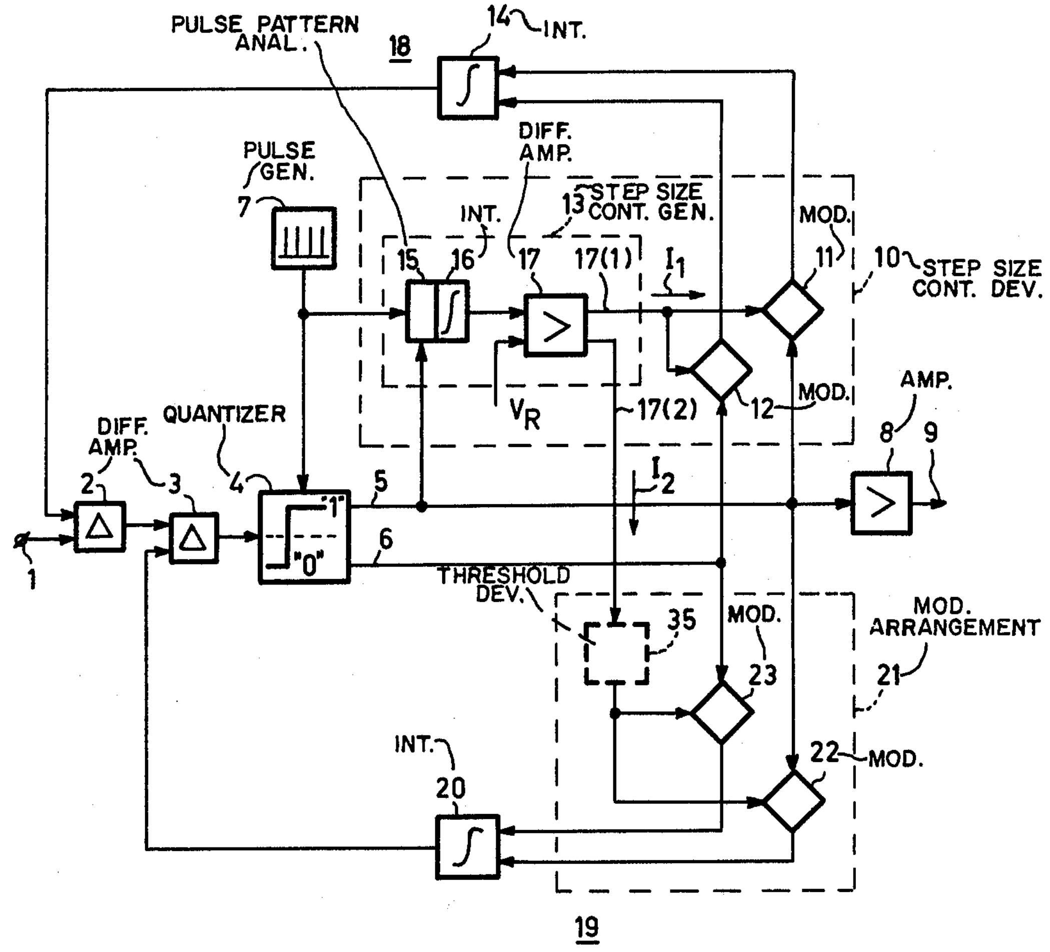
FIG. 1 shows a delta-modulation coding arrangement provided with the measures according to the invention.

FIG. 1 shows a delta-modulation encoding arrangement according to the invention. This encoding arrangement is arranged for converting an information signal in the form of, for example, a speech signal which is located in the band of 0.3–3.4 kHz into a delta-modulation pulse series. Said information signal is applied to a first input of a difference amplifier 2 through an input circuit 1. The output of said amplifier 2 is connected to the input of a quantizing device 4 through a second difference amplifier 3. This quantizing device 4 which here also functions as a decision switch comprises two outputs 5 and 6 at which mutually complementary digital signals occur. Furthermore this quantizing device 4 is controlled by sampling pulses which are produced by a pulse generator 7. In known manner this quantizing device 4 produces at its output 5 a pulse having the binary value "1" if at the sampling instant, that is to say at the instant a sampling pulse occurs, the output signal of the difference amplifier 3 is positive. If, however, at a given sampling instant the output signal of the difference amplifier 3 is negative, a pulse having the binary value "1" occurs at the output 6 of the quantizing device.

The output pulses produced at the output 5 of the quantizing device 4 can be used for transmission to an associated receiver. For this purpose the output pulses are applied through an output amplifier 8 and a modulation stage not further shown in this Figure to a transmission medium which is represented symbolically in the Figure by the output lead 9.

The output pulses which are produced at the outputs 5 and 6 of the quantizing device are further applied to a step-size control circuit 10. This circuit 10 is constituted by two modulators 11 and 12 to which respectively the output pulses produced at the outputs 5 and 6 of the quantizing device 4 are applied. These modulators are controlled by a step-size control generator 13 which varies the energy contents of the output pulses of the quantizing device 4 applied to the modulators 11 and 12 in proportion to the step-size. The output pulses of the modulators may be amplitude- or width modulated. The outputs of these modulators 11 and 12 are each connected to an input circuit of an integrating network 14 which functions as a decoder, and which produces at its output a signal which is applied to a second input of the difference amplifier 2.

If in particular a pulse having the binary value "1" is produced at the output 5 of the quantizing device 4 then the output voltage of the integrating network 14 is increased by an amount which is proportional to the step-size produced by the step-size generator 13. If, however, a pulse having the binary value "1" is produced at the output 6 of the quantizing device 4 then the output voltage of the integrating network 14 is reduced by an amount which is proportional to the step-size produced by the step-size generator 13. The output pulses of the modulators 11 and 12 will hereinafter be referred to as charge and discharge pulses respectively.

The step-size generator 13 of prior U.S. Pat. Nos. 3,729,678 and 3,831,092 may be used here. More particularly, the step-size generator 13 comprises for this purpose a pulse pattern analyser 15 which is constructed in the manner already described in said U.S. Pat. No. 3,729,678. This pulse pattern analyser 15 analyses the pulses produced at the output 5 of the quantizing device 4 and produces an output pulse each time a predetermined pulse pattern occur. Said pulse pattern is formed by output pulses which are produced at the output 5 of the quantizing device in a period which is equal to at least three periods of the pulse generator 7. Both the output pulses of the pulse generator and the pulses produced at the output 5 of the quantizing device 4 are applied for this purpose in this embodiment to the pulse pattern analyser 15. The output pulses of the pulse pattern analyser 15 are applied to an integrating network 16 whose output signal is a measure of said step-size.

In the embodiment shown the output signal of the integrating network 16 is applied to the two modulators 11 and 12 through a difference amplifier 17 which will be described in detail hereinafter.

The delta-modulation encoding arrangement is further provided with a second feedback circuit 19. As in the second feedback circuit described in prior U.S. Pat. No. 3,831,092 the feedback circuit 19 comprises an integrating network 20 whose output is connected to a second input of the difference amplifier 3.

To obviate the problems of the prior art device and which are described already in the preamble, the output pulses which are produced at the outputs 5 and 6 of the quantizing device 4 are now applied to a modulation arrangement 21 which in this embodiment comprises two modulators 22 and 23 to which the output pulses produced at the outputs 5 and 6 respectively of the quantizing device 4 are applied. These modulators are controlled by a control signal which is also produced by the difference amplifier 17. In these modulators 22 and 23 the energy contents of the pulses applied to them is varied in proportion to this control signal. As for the modulators 11 and 12 it also now holds that this variation may, for example, be done by means of amplitude or width modulation of these pulses. Each output of these modulators 22 and 23 is connected to an input circuit of the integrating network 20.

The output voltage of the integrating network 20 is now affected by the output pulses of the quantizing device 4 in the same manner as the output voltage of the integrating network 14 in the feedback circuit 18, however, in such a way that when the signal at the output 17(1) of the amplifier 17 increases, the signal at the output 17(2) decreases proportionately to this increase. By means of these output voltages of the difference amplifier 17 which vary in opposite directions relative to one another, pulses are applied to the integrating network 14 with, for example, a large energy contents and, simultaneously, pulses having a low energy contents are applied to the integrating network 20; or vice versa.

The invention now uses the knowledge that the influence of the drift voltages, which are produced in the delta-modulation encoding arrangement, on the signal quantization-to-noise-ratio is negligibly small for signals of a large amplitude.

As already indicated in chapter (B) an extra DC voltage is produced at the output of the integrating network 14 owing to the action of the delta-modulation encoding arrangement if a charge pulse has an energy content which is unequal to the energy content of a discharge pulse which is produced at the output 17(1) of the amplifier 17 at a same value of the output voltage. By using the measures according to the invention this DC voltage, which may be considered as extra drift voltage is only partly compensated by the output voltage of the integrating network 20 if the information signal has a high value. However, if the information signal has a small value then this DC voltage as well as the drift voltage is fully compensated. This results in a proper encoding of small signals which are produced after a large negative slope of the information signal. If, more in particular the information signal decreases rapidly from a large to a small value, then this decrease is accurately followed by the output signal of the integrating network 14 and at the same time a DC voltage is rapidly increasing output signal is produced by the integrating network 20 by increasing the energy content of the output pulses of the modulators 22 and 23, the magnitude of this DC voltage being exactly the same as the sum of the drift voltages and the DC voltage which is produced by the integrating network 14 after the rapid decrease of the information signal and which is the result of the above-mentioned inequality of charge and discharge pulses. The result hereof is that after a large negative slope of the information signal the input signal of the delta-modulation encoding arrangement to be encoded is exclusively formed by the information signal itself.

AN EMBODIMENT OF THE DIFFERENCE AMPLIFIER 17

Figure 2:
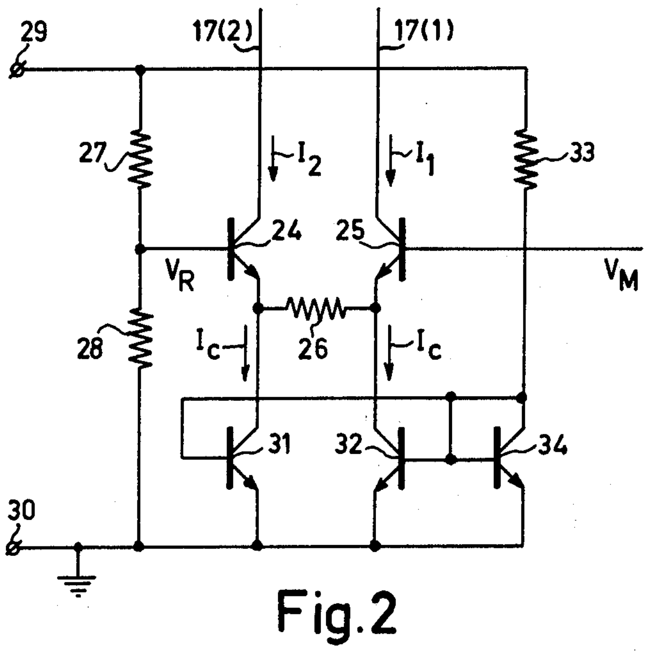
FIG. 2 shows an amplifier circuit suitable for use in the coding arrangement according to FIG. 1.

A favourable embodiment of the difference amplifier 17 indicated in FIG. 1 is shown in FIG. 2. This amplifier is arranged for supplying amplitude-modulated currents. For this purpose this amplifier 17 comprises a difference amplifier which is composed of two npn transistors 24 and 25, whose emitters are interconnected through a resistor 26. A reference voltage $V_R$ is applied to the base of transistor 24. This reference voltage is obtained by means of a voltage divider which is constituted by two resistors 27 and 28 which are connected in series between the positive and negative terminal 29 or 30 of a DC voltage source. The voltage $V_M$ which is produced by the integrating network 16 shown in FIG. 1 is fed to the base of the transistor 25. Each of the emitters of the transistors 24 and 25 are connected to the terminal 30 of the DC voltage source through a transistor 31 or 32. These transistors 31 and 32 can be considered as current sources for which purpose the bases of these transistors 31 and 32 are connected to the voltage dividing point of a voltage divider which is constituted by a series arrangement of a resistor 33 and a transistor 34 which functions as a diode and which is connected between the two terminals 29 and 30. The outputs 17(1) and 17(2) of this amplifier circuit are constituted by the collector circuits of the transistors 25 and 24 respectively.

In the encoding arrangement shown in FIG. 1 the output currents produced at the outputs 17(1) and 17(2) in known manner such as, for example, described in the prior U.S. pat. application Ser. No. 639,579, filed Dec. 10, 1975, now U.S. Pat. No. 4,039,950 are applied to the network 14 and 20 respectively through the modulators 11 and 12 or 22 and 23 each time during a fixed period of time.

When the output current at the output 17(1) is represented by $I_1$ and the output current at the output 17(2) by $I_2$ then the relation between an output current, the control voltage $V_M$ and the reference voltage $V_R$ be expressed in a first proximation by the following expressions:

$$I_1 = A(V_M - V_R) + I_C$$

$$I_2 = -A(V_M - V_R) + I_C$$

$$\text{for: } |A(V_M - V_R)| \leq I_C.$$

In these expressions $A$ is the steepness of the difference amplifier which is constituted by means of the two transistors 24 and 25 and the resistor 26 and $I_C$ represents the quiescent current through the two transistors 24 and 25.

Figure 3:
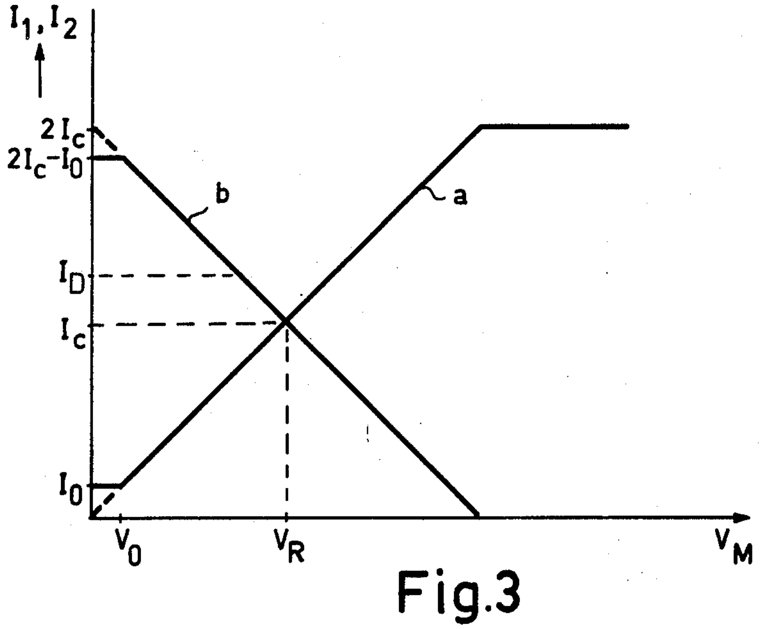
FIG. 3 shows diagrams to illustrate the relation between input and output signals of the amplifier circuit shown in FIG. 2.

In FIG. 3 the curve *a* shows the variation of the current $I_1$ as a function of the voltage $V_M$ and curve *b* the variation of the current $I_2$. It is assumed that the voltage $V_M$ has a predetermined minimum value $V_O$ which corresponds with a predetermined minimum step size $I_O$. It appears from this FIG. 3 that the energy content, that is to say the amplitude in the embodiment described, of the current pulses which are applied to the integrating network 20 increases if the energy content of the current pulses which are applied to the integrating network 14 decreases and vice versa.

FURTHER EMBODIMENTS OF THE ARRANGEMENT OF FIG. 1

In a further embodiment of the arrangement according to the invention a threshold device 35 is connected to the output 17(2) of the difference amplifier 17 in the manner as shown diagrammatically in FIG. 1. This threshold device is, for example, constituted by means of a clipper circuit which applies the output current $I_2$ of the amplifier 17 to the modulators 22 and 23 only in the case that $I_2$ exceeds in absolute value a predetermined value $I_D$. In this case a compensation voltage is only produced by the integrating network 20 if $I_2$ exceeds or is equal to the threshold value $I_D$ (see also FIG. 3). If in the limit case $I_D$ is chosen to be equal to the maximum value of $I_2$, that is to say equal to $2I_C - I_O$ in the case described above, then a compensation voltage is only produced by the integrating network 20 if the energy content of the charge and discharge pulses of the integrating network 14 corresponds to the minimum step size ($I_1 = I_O$)

SOME ADDITIONAL REMARKS.

In the embodiment shown in FIG. 1 the control signal for the modulation arrangement 21 is derived in the second feedback circuit 19 from the output signal of the integrating network 16. However, this control signal may also be directly derived from the output pulses which are produced at the output 6 of the quantizing device 4. Namely, from the frequency of pulse changes, that is to say the frequency in which an "1" is followed by a "0" pulse or a "0" pulse by a "1" pulse a control signal can be derived for the modulators 22 and 23. A circuit for producing the control signal in this manner has already been described in U.S. Pat. No. 2,816,267. Herein the control signal increases when the frequency of pulse changes decreases and the control signal decreases when this frequency increases.

It should be noted that the measures according to the invention are not limited to delta-modulation encoding arrangement of the adaptive type described above, but can also be used in delta-modulation encoding arrangements in which the dynamic compression is done in another manner than described above.

What is claimed is:

1. A delta-modulation encoding arrangement for information signals comprising an input circuit which comprises a cascade circuit of a decoding arrangement and a comparison circuit coupled to said decoding arrangement, input means for receiving said information signals and for providing it to said cascade circuit, and output means for providing an output signal; a quantizing device means having an input coupled to said input circuit output means, and an output means for producing delta-modulation output pulses; a pulse generator coupled to said quantizing device; a feedback circuit coupled between said quantizing device output means and said cascade circuit and including dynamic compression step-size control device means for varying the energy contents of the delta modulation output pulses applied to said cascade circuit; and compensation means comprising a modulation arrangement having an input coupled to said quantizing device output means for receiving said delta-modulation output pulses, an output, and a control signal input means coupled to one of said device means for receiving a control signal derived from said output pulses, and an integrator coupled between said modulation arrangement output and said cascade circuit.

2. A delta-modulation encoding arrangement as claimed in claim 1, wherein said modulation arrangement includes modulator means for continously varying and in a direction which is opposite to the direction of variation of the energy contents of the pulses supplied by said quantizing device output means the energy contents of pulses applied to said integrator.

3. A delta-modulation encoding arrangement as claimed in claim 1, further comprising a threshold device coupled between said control signal input means and one of said device means, said threshold device being adjusted to a threshold value to apply said output pulses only if said output signal has a value which is at least equal to the threshold value.

4. A delta-modulating encoding arrangement as claimed in claim 2, wherein pulses applied through the feedback circuit to the cascade circuit have at least a predetermined minimum energy content, said modulation arrangement being arranged to apply the delta-modulation output pulses applied to the modulation arrangement to said integrator when the pulses applied thereto have said minimum energy content.

* * * * *